(12) United States Patent
Huang et al.

(10) Patent No.: US 10,756,297 B2
(45) Date of Patent: Aug. 25, 2020

(54) FLEXIBLE PANEL, MANUFACTURING METHOD FOR THE SAME AND DISPLAY DEVICE

(71) Applicant: Wuhan China Star Optoelectronics Semiconductor Display Technology Co., Ltd., Wuhan, Hubei (CN)

(72) Inventors: Jing Huang, Guangdong (CN); Hsiang Lun Hsu, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/128,933

(22) Filed: Sep. 12, 2018

(65) Prior Publication Data

US 2019/0326544 A1    Oct. 24, 2019

Related U.S. Application Data

(63) Continuation of application No. PCT/CN2018/092250, filed on Jun. 21, 2018.

(30) Foreign Application Priority Data

Apr. 19, 2018    (CN) .......................... 2018 1 0353946

(51) Int. Cl.
*H01L 51/52* (2006.01)
*H01L 51/56* (2006.01)
(Continued)

(52) U.S. Cl.
CPC ........ *H01L 51/5246* (2013.01); *G02F 1/1339* (2013.01); *H01L 51/525* (2013.01);
(Continued)

(58) Field of Classification Search
CPC .............. G02F 1/1339; G02F 1/13392; G02F 1/13394; G02F 2001/13396; G02F 2001/13398
See application file for complete search history.

(56) References Cited

U.S. PATENT DOCUMENTS

| 6,016,180 A | * | 1/2000 | Bradshaw | ........... G02F 1/13394 349/156 |
| 2007/0182912 A1 | * | 8/2007 | Kobayashi | ............ G02F 1/1339 349/153 |

(Continued)

FOREIGN PATENT DOCUMENTS

| CN | 105374947 A | 3/2016 |
| CN | 105914224 A | 8/2016 |

(Continued)

OTHER PUBLICATIONS

International search report dated Jan. 18, 2019 from corresponding application No. PCT/CN2018/092250.

*Primary Examiner* — Eric A. Ward
(74) *Attorney, Agent, or Firm* — Leong C. Lei

(57) ABSTRACT

A flexible panel is provided. The flexible panel includes a substrate, an organic light-emitting diode device, a thin-film encapsulation layer and a retaining wall. Wherein the organic light-emitting diode device is formed on the substrate, the thin-film encapsulation layer is formed on the substrate and covers the organic light-emitting diode device, the retaining wall is disposed on the substrate and is around an outside of the organic light-emitting diode device. Wherein the first portion is closer to a light-emitting region of the flexible panel than the second portion. A manufacturing method for the flexible panel and a display device using the flexible panel are also disclosed.

7 Claims, 5 Drawing Sheets

(51) Int. Cl.
H01L 27/32 (2006.01)
G02F 1/1339 (2006.01)

(52) U.S. Cl.
CPC .......... H01L 51/5253 (2013.01); H01L 51/56 (2013.01); *H01L 27/3246* (2013.01); *H01L 27/3258* (2013.01); *H01L 2227/323* (2013.01); *H01L 2251/5338* (2013.01); *H01L 2251/558* (2013.01)

(56) References Cited

U.S. PATENT DOCUMENTS

| | | | | |
|---|---|---|---|---|
| 2007/0211202 | A1* | 9/2007 | Ishii | G02F 1/1339 349/153 |
| 2009/0066903 | A1* | 3/2009 | Yoshida | G02F 1/1339 349/153 |
| 2010/0225875 | A1* | 9/2010 | Wang | G02F 1/1339 349/160 |
| 2010/0259707 | A1* | 10/2010 | Iwata | G02F 1/133351 349/73 |
| 2012/0013970 | A1* | 1/2012 | Shin | G02F 1/167 359/296 |
| 2014/0217371 | A1* | 8/2014 | Kim | H01L 51/5256 257/40 |
| 2014/0268606 | A1* | 9/2014 | Chen | H05K 3/284 361/760 |
| 2015/0264805 | A1* | 9/2015 | Chen | H05K 3/0052 361/748 |
| 2016/0116772 | A1* | 4/2016 | Cha | G02F 1/1339 349/123 |
| 2016/0195741 | A1* | 7/2016 | Shiau | G02F 1/1337 349/106 |
| 2016/0268547 | A1 | 9/2016 | Kim et al. | |
| 2017/0010490 | A1* | 1/2017 | Li | G02F 1/1339 |
| 2017/0062534 | A1* | 3/2017 | Jiang | H01L 51/5253 |
| 2017/0082885 | A1* | 3/2017 | Lee | G02F 1/13394 |
| 2017/0117502 | A1* | 4/2017 | Park | H01L 27/3258 |
| 2017/0141352 | A1* | 5/2017 | Shin | H01L 27/3276 |
| 2017/0184899 | A1* | 6/2017 | Saeki | G02F 1/133345 |
| 2017/0227804 | A1* | 8/2017 | Nagasawa | G02F 1/13394 |
| 2017/0299916 | A1* | 10/2017 | Kobayashi | G02F 1/133345 |
| 2017/0345881 | A1* | 11/2017 | Kim | H01L 27/3262 |
| 2019/0288234 | A1* | 9/2019 | Kim | H01L 27/3276 |
| 2019/0305059 | A1* | 10/2019 | Hou | H01L 51/0004 |

FOREIGN PATENT DOCUMENTS

| | | |
|---|---|---|
| CN | 106450038 A | 2/2017 |
| CN | 106848107 A | 6/2017 |
| CN | 107170792 A | 9/2017 |

* cited by examiner ically sensitive to external water and oxygen, flexible encapsulation technology is directly related to the display life of the OLED, and is also one of the bottlenecks restricting the development of the OLED.

FLEXIBLE PANEL, MANUFACTURING METHOD FOR THE SAME AND DISPLAY DEVICE

CROSS-REFERENCE TO RELATED APPLICATION

This application is a continuing application of PCT Patent Application No. PCT/CN2018/092250, entitled "FLEXIBLE PANEL, MANUFACTURING METHOD FOR THE SAME AND DISPLAY DEVICE", filed on Jun. 21, 2018, which claims priority to China Patent Application No. CN201810353946.4 filed on Apr. 19, 2018, both of which are hereby incorporated in its entireties by reference.

FIELD OF THE INVENTION

The present invention relates to a flexible panel, manufacturing method for the same and display device using the flexible panel.

BACKGROUND OF THE INVENTION

An Organic Light Emitting Diode (OLED) has the advantages of fast response, wide temperature range, self-illumination, flexible display, etc. It is known as the third generation display technology after cathode ray tube display and liquid crystal display. With the increasing market demand, the development and production of the flexible OLED has become a hot field in the display industry. However, since organic materials are particularly sensitive to external water and oxygen, flexible encapsulation technology is directly related to the display life of the OLED, and is also one of the bottlenecks restricting the development of the OLED.

At present, the flexible OLED encapsulation mainly adopts a thin-film encapsulation structure (TFE) in which an inorganic layer and an organic layer are alternately stacked, and it is required to not only fully shield the external water and oxygen, but also effectively cover particle contamination that cannot be avoided in the production process, and buffer stress generated during bending and folding. However, since the monomer used for coating the organic layer is better in fluidity and the boundary of the organic layer is not well controlled, a retaining wall is disposed on the periphery of the display region to block the flowing organic layer monomer. Because the material of the retaining wall is also an organic material, the water vapor is easy to penetrate. In order to completely block the overflow of the flowing organic monomer, at least two retaining walls are generally provided. This requires that the outermost boundary of the inorganic layer of the TFE package should extend to cover the outermost retaining wall, so as to ensure that the edge does not invade by the water and oxygen quickly, but this will cause the boundary of the TFE package structure to expand too much, which is not conducive to narrow frame design.

SUMMARY OF THE INVENTION

Accordingly, the present application provides a flexible panel that facilitates the design of a narrow frame and a display device using the same.

A flexible panel, comprising: a substrate, an organic light-emitting diode device, a thin-film encapsulation layer and a retaining wall; wherein the organic light-emitting diode device is formed on the substrate, the thin-film encapsulation layer is formed on the substrate and covers the organic light-emitting diode device, the retaining wall is disposed on the substrate and is around an outside of the organic light-emitting diode device; and wherein the retaining wall includes a first portion and a second portion, the first portion is closer to a light-emitting region of the flexible panel than the second portion.

A display device, comprising: a flexible panel and a cover plate disposed on the flexible panel; wherein the flexible panel comprises; a substrate, an organic light-emitting diode device, a thin-film encapsulation layer and a retaining wall; wherein the organic light-emitting diode device is formed on the substrate, the thin-film encapsulation layer is formed on the substrate and covers the organic light-emitting diode device, the retaining wall is disposed on the substrate and is around an outside of the organic light-emitting diode device; and wherein the retaining wall includes a first portion and a second portion, the first portion is closer to a light-emitting region of the flexible panel than the second portion.

A manufacturing method for a flexible panel, comprising steps of: forming a planarization layer and a portion of a retaining wall on a substrate by a same mask;

forming a first electrode pattern on the planarization layer;

forming the pixel definition layer and the other portion of the retaining wall on the planarization layer and the substrate using a same mask, wherein the pixel definition layer correspondingly defines a space of a light-emitting pixel on the planarization layer and the first electrode; forming an organic light-emitting structure in a region where a light-emitting pixel defined by the pixel definition layer is located; forming a second electrode on the organic light-emitting structure; and forming a thin-film encapsulation layer on the substrate to perform an encapsulation.

In the flexible panel and the manufacturing method for a flexible panel of the present application, the retaining wall made by the same mask of the planarization layer and the pixel definition layer is a staggered two-layer structure, which can effectively block the overflow of the fluid organic monomer, and is advantageous to realize the narrow frame design of the flexible panel.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF PREFERRED EMBODIMENTS

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
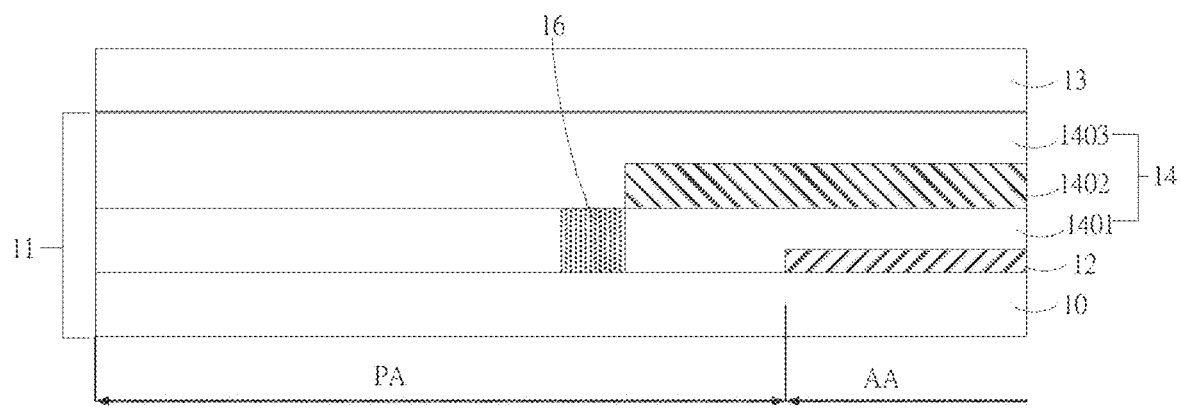
FIG. 1 is a schematic diagram of a display device according to a first embodiment of the present application.

FIG. 1 is a schematic structural diagram of a display device 1 according to a first embodiment of the present application. As shown in FIG. 1, the display device 1 includes a flexible panel 11 and a cover plate 13 disposed on the flexible panel 11. The flexible panel 11 includes a substrate 10, an organic light-emitting diode device 12, a thin-film encapsulation layer 14, and a retaining wall 16.

The OLED device 12 is formed on the substrate 10 and includes multiple light-emitting pixels 120 (see FIG. 2) arranged as a matrix for emitting light under the control of an electrical signal to display an image. A region of the organic light-emitting diode device 12 corresponding to the flexible panel 11 for displaying an image is defined as a light-emitting region, and the other portion is defined as a peripheral region. Apparently, a region of the organic light-emitting diode device 12 distributed on the substrate 10 is greater than or equal to the light-emitting region.

The thin-film encapsulation layer 14 is formed on the substrate 10 and covers the organic light-emitting diode device 12. The thin-film encapsulation layer 14 includes at least one inorganic layer and at least one organic layer, and the inorganic layer and the organic layer are alternately laminated to form a multi-layer film structure. The organic layer covers a side of the retaining wall 16 facing the AA region is used for providing flexibility to the flexible panel 11. The inorganic layer covers the entire region of the substrate 10 to prevent penetration of oxygen or moisture. In the embodiment, the thin-film encapsulation layer 14 includes a first inorganic layer 1401, a first organic layer 1402, and a second inorganic layer 1403.

The substrate 10 is made of a glass material or a transparent plastic material having better mechanical strength, thermal stability, transparency, surface smoothness, operability, and water repellency. It can be understood that a functionalized film layer such as a planarization layer or the like may be further disposed on the surface of the substrate 10 in order to improve the performance of the substrate 10.

Figure 2:
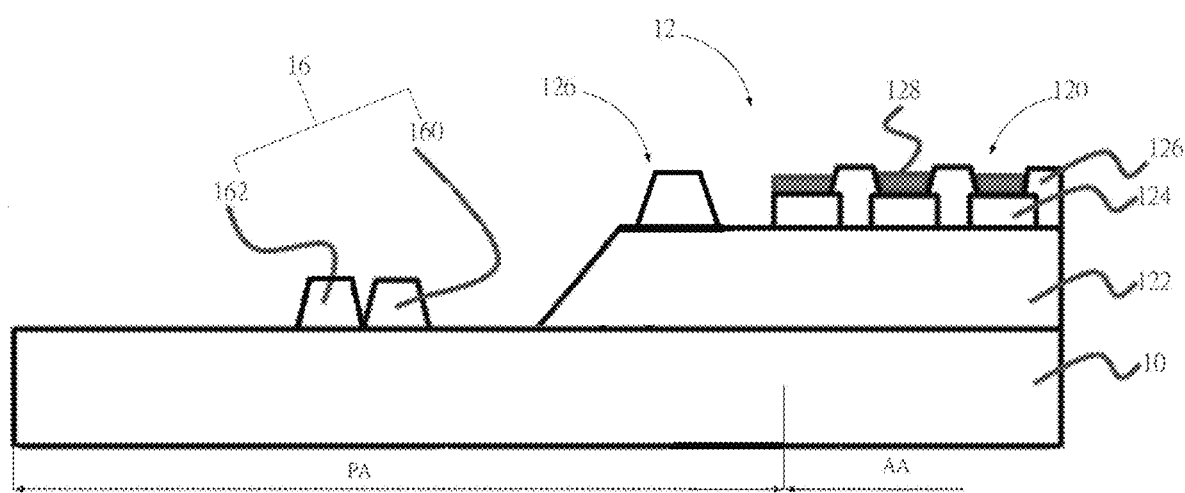
FIG. 2 is a cross-sectional diagram of an organic light-emitting diode device and a retaining wall of FIG. 1.

FIG. 2 is a cross-sectional view of the organic light-emitting diode device 12 and the retaining wall 16 in FIG. 1.

As shown in FIG. 2, the OLED device 12 is disposed on the substrate 10, and includes a driving circuit (not shown), a planarization layer 122, a first electrode 124, a pixel definition layer 126, and an organic light-emitting structure 128 and a second electrode (not shown) which are sequentially formed on the substrate 10.

The driving circuit corresponding to the light-emitting pixels 120 of the OLED device 12 is distributed as a matrix and is respectively connected to the organic light-emitting structure 128 through the first electrode 124 for controlling the illuminating condition of the corresponding organic light-emitting structure 128 in the light-emitting pixels 120. The driving circuit may be a thin-film transistor (TFT) including a gate electrode, a channel layer, a source electrode, and a drain electrode.

The planarization layer 122 is disposed on the substrate 10 and covers the driving circuit and other circuit structures formed on the substrate 10. The thickness of the planarization layer 122 should be sufficient to cover the driving circuit and other circuit structures formed on the substrate 10. The planarization layer 122 may be a single-layer structure or a multi-layer structure including two or more film layers.

The first electrode 124 may be a cathode or an anode formed on the planarization layer 122 by a vacuum deposition method, a sputtering method, or the like. The first electrode 124 may be a transparent electrode, a translucent electrode or a reflective electrode. In addition, the first electrode 124 may also undergo various structural changes, for example, the first electrode 124 may have a two-layer or a multi-layer structure formed using two or more different materials.

The pixel definition layer 126 is formed on the planarization layer 122 and the first electrode 124 to correspondingly define a space of each light-emitting pixel 120. The pixel definition layer 126 may be formed of one or a combination of an organic material or an inorganic material, for example, an organic material selected from a photoresist, an epoxy resin, a poly(methyl methacrylate) resin, a polyimide resin, an acrylic resin, and the like or one or a combination of an inorganic material such as a silicon compound.

The second electrode may be a cathode or an anode and formed by a vacuum deposition method, a sputtering method, or the like. The material of the second electrode may be a metal, an alloy, a conductive compound, and a mixture thereof having a low work function. In addition, the second electrode may also be subjected to various structural changes, for example, the second electrode may have a two-layer or multi-layer structure formed using two or more different materials.

The organic light-emitting structure 128 is located between the first electrode 124 and the second electrode, and is respectively disposed in a space of the light-emitting pixel 120 defined by the adjacent pixel definition layer 126. The organic light-emitting structure 128 may include a hole injection layer, a hole transport layer, a light-emitting layer, an electron transport layer, an electron injection layer, and an optical path adjustment layer on the cathode. The hole injection/transport layer is connected to the anode. The electron injection/transport layer is connected to the cathode. The light-emitting layer is made of an organic luminescent material that emits light under the control of electrical signals introduced by the anode and cathode.

Figure 3:
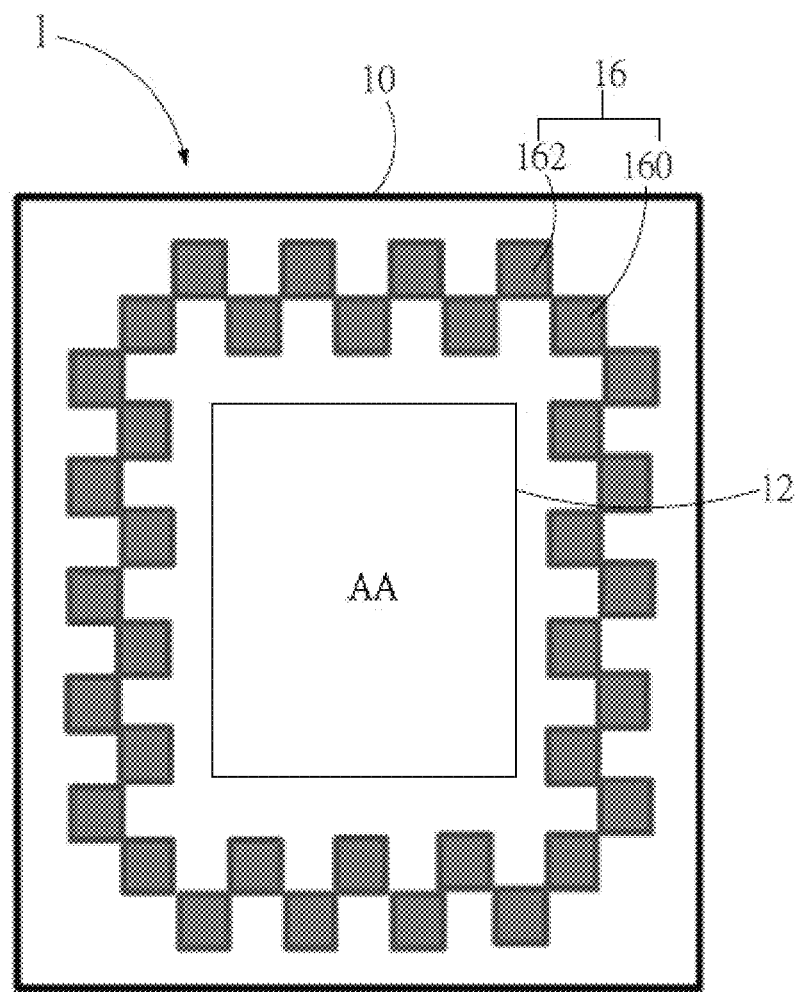
FIG. 3 is a schematic diagram of the shape of the retaining wall of FIG. 1.

FIG. 3 is a schematic diagram of the shape of the retaining wall 16 in FIG. 1.

Referring to FIG. 1, FIG. 2 and FIG. 3 together, the retaining wall 16 is disposed on the substrate 10 and is around an outside of the OLED device 12. The retaining wall 16 includes a first portion 160 and a second portion 162. In some embodiments, the first portion 160 and the second portion 162 are interconnected to form a closed structure. The first portion 160 and the second portion 162 are not overlapped each other in a direction perpendicular to a side of the substrate 10 in a plane in which the substrate 10 is located. The first portion 160 is closer to the light-emitting region than the second portion 162. Apparently, in some embodiments, a certain gap is existed between the first portion 160 and the second portion 162 so that the retaining wall 16 constitutes a structure that is not completely enclosed.

In the present embodiment, each of the first portion 160 and the second portion 162 of the retaining wall 16 includes multiple protrusions that are disposed at intervals and around the organic light-emitting diode device 12. The protrusions of the first portion 160 and the protrusions of the second portion 162 are staggered. In this embodiment, the protrusion is a trapezoidal structure having a narrow upper width and a wide lower width. It can be understood that in other embodiments, the protrusion may also be other three-dimensional shapes, such as a cuboid, a cube, a vertebral table, and the like.

In the embodiment, the first portion 160 is a turn of protrusions that are disposed at intervals and around the organic light-emitting diode device 12. The second portion 162 is another turn of protrusions that are disposed at intervals, around and farther from the organic light-emitting diode device 12. The protrusions of the first portion 160 and the protrusions of the second portion 162 are staggered to satisfy the condition that the first portion 160 and the second portion 162 are not overlap each other in a direction perpendicular to a side of the substrate 10 in a plane in which the substrate 10 is located.

In the present embodiment, the protrusions of the first portion 160 and the adjacent protrusions of the second portion 162 are tightly closed to each other along the extending direction of the retaining wall 16, and no gap is provided between them.

It can be understood that, in other embodiments, a slight gap may be disposed between the protrusion of the first portion 160 and the protrusion of the adjacent second portion 162 along the extending direction of the retaining wall 16. The slight gap satisfies the fact that the liquid does not overflow from the slight gap because of the tension, so that the retaining wall 16 of the structure can still function to block the overflow of the flowing organic monomer.

In this embodiment, the protrusions of the first portion 160 and the protrusions of the second portion 162 are consistent in shape and size, and a height of each of the protrusions of the first portion 160 and the protrusions of the second portion 162 is in range of 0.01 to 3 micrometers (um), and a width of each of the protrusions of the first portion 160 and the protrusions of the second portion 162 is in a range of 5 um to 50 um. The retaining wall 16 is formed in the same mask process as the pixel definition layer 126 by using a mask for fabricating the pixel definition layer 126. A material of the retaining wall 16 and a material of the pixel definition layer 126 are the same, and may be formed of an organic material or an inorganic material, for example, one or a combination of an organic material selected from a photoresist, epoxy resin, poly(methyl methacrylate) resin, polyimide resin, acrylic resin or one or a combination of an inorganic material such as a silicon compound.

The manufacturing process of the flexible panel may be: forming a planarization layer 122 and a portion of a retaining wall 16 on a substrate 10 by a same mask; then forming a first electrode 124 pattern on the planarization layer 122; forming the pixel definition layer 126 and the other portion of the retaining wall 16 on the planarization layer 122 and the substrate 10 using a same mask; then forming an organic light-emitting structure 128 in a region where a light-emitting pixel 120 defined by the pixel definition layer 126 is located; and then forming a second electrode on the organic light-emitting structure 128; finally, forming a thin-film encapsulation layer 14 on the substrate 10 to encapsulate an organic light-emitting diode device 12 and the retaining wall 16 on the substrate 10.

Figure 4:
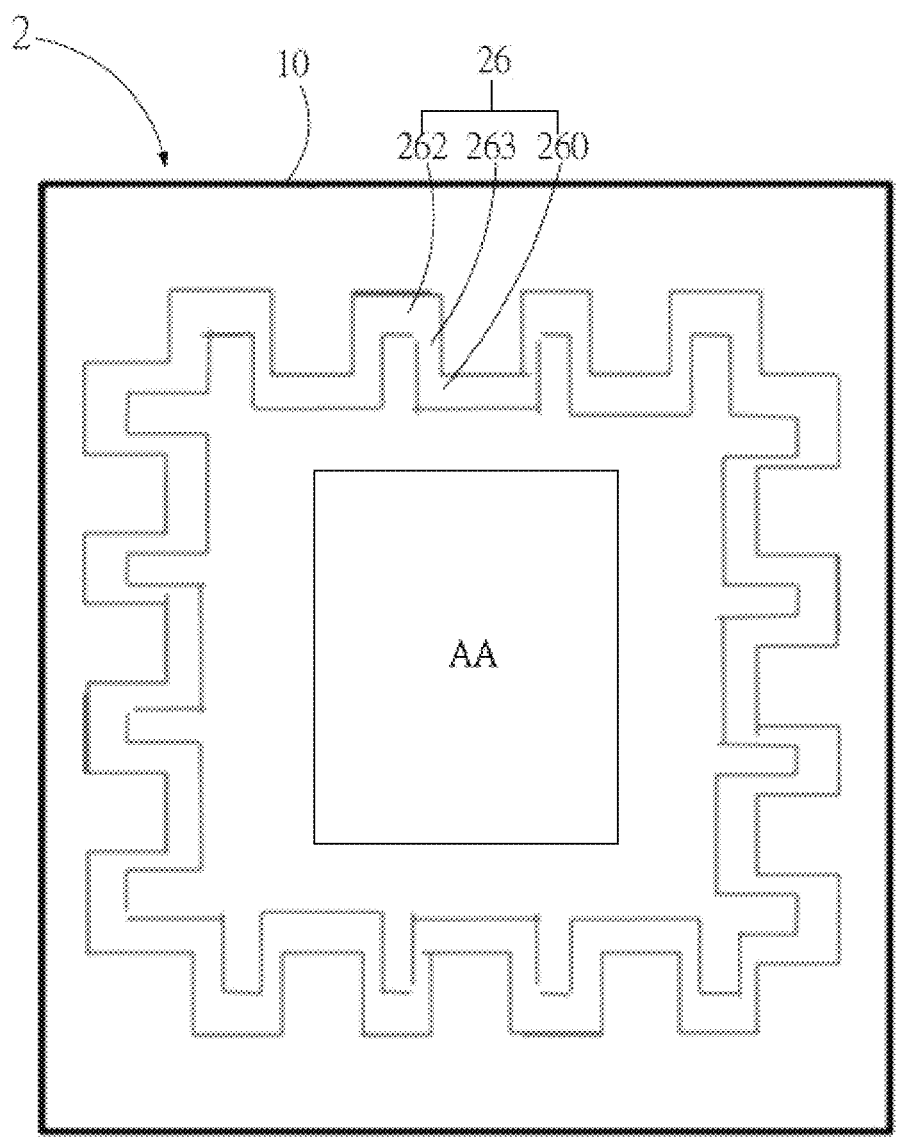
FIG. 4 is a schematic view diagram of the shape of the retaining wall according to the second embodiment of the present application.
Figure 5:
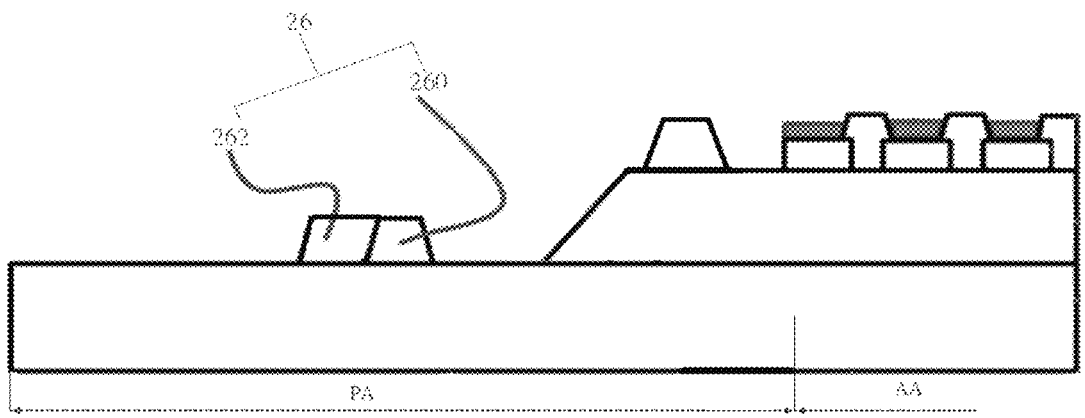
FIG. 5 is a cross-sectional view of the organic light-emitting diode device and the retaining wall of FIG. 4.

FIG. 4 and FIG. 5 are respectively a schematic diagram and a cross-sectional diagram of the retaining wall 26 in the flexible panel 2 provided by a second embodiment of the present application.

As shown in FIG. 4 and FIG. 5, the second embodiment of the flexible panel 2 of the present application is substantially the same as the flexible panel 11 of the first embodiment of the present application, except that the retaining wall 26 of the flexible panel 2 of the second embodiment is an integral structure, the retaining wall 26 includes a first portion 260, a second portion 262, and a side wall 263 that connects the first portion 260 and the second portion 262. The first portion 260 and the second portion 262 are mutually staggered, and the adjacent first portion 260 and the second portion 262 are integrally connected through the side wall 263 to form a saw-tooth closed structure.

Figure 6:
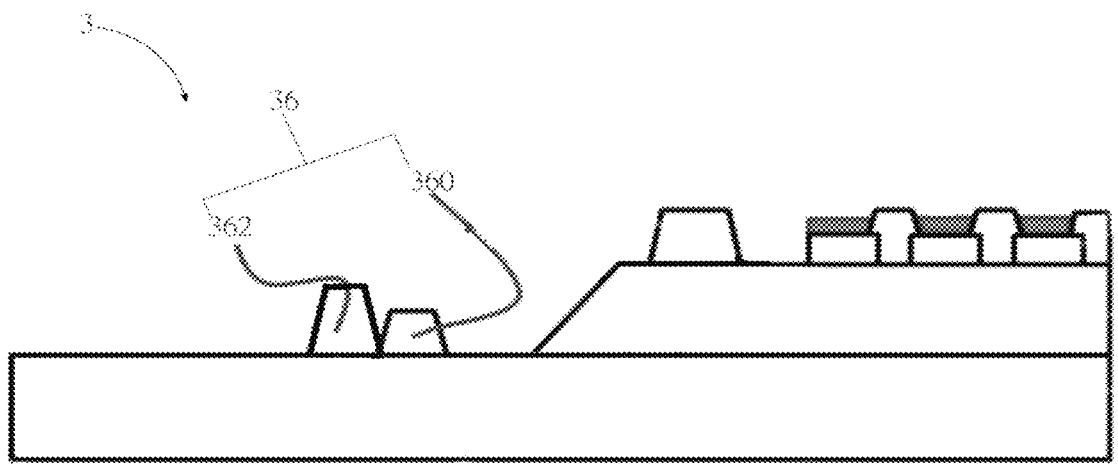
FIG. 6 is a schematic diagram of the shape of the retaining wall according to the third embodiment of the present application.

FIG. 6 is a schematic diagram of a shape of the retaining wall 36 in the flexible panel 3 according to the third embodiment of the present application.

As shown in FIG. 6, the flexible panel 3 of the third embodiment of the present application is substantially the same as the flexible panel 11 of the first embodiment of the present application, except that a height of the first portion 360 of the retaining wall 36 in the flexible panel 3 of the third embodiment closer to the organic light-emitting diode device 32 is less than a height of the second portion 362 closer to an outside. The height of the first portion 360 is in a range of 0.5 um to 2 um. A height of the second portion 362 is in a range of 1 um to 3 um.

Figure 7:
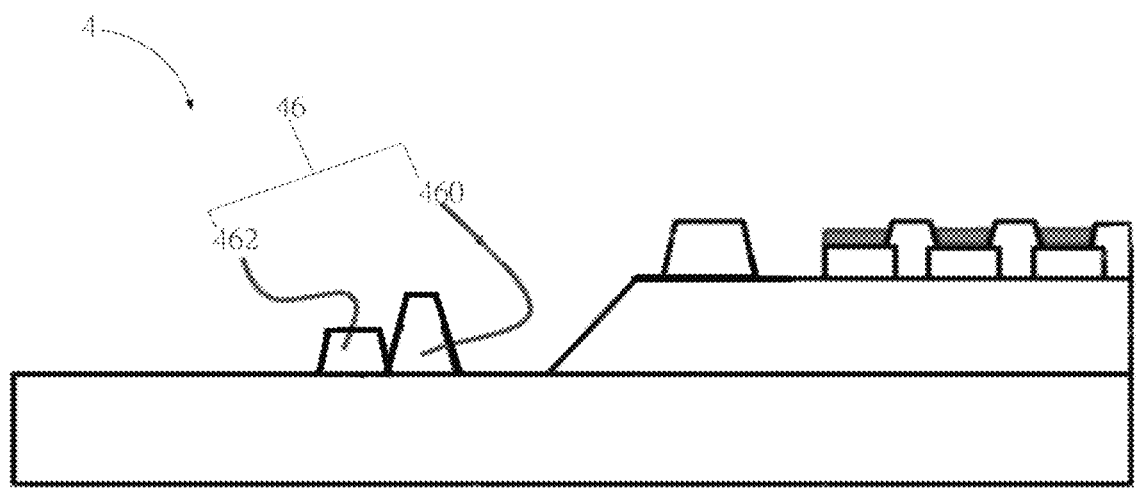
FIG. 7 is a schematic diagram of the shape of the retaining wall according to the fourth embodiment of the present application.

FIG. 7 is a schematic diagram of the shape of the retaining wall 46 in the flexible panel 4 according to the fourth embodiment of the present application.

As shown in FIG. 7, the flexible panel 4 of the fourth embodiment of the present application is substantially the same as the flexible panel 11 of the first embodiment of the present application, except that a height of the first portion 460 of the retaining wall 46 in the flexible panel 4 of the fourth embodiment closer to the organic light-emitting diode device 32 is greater than a height of the second portion 462 closer to an outside. The height of the first portion 460 is in a range of 1 um to 3 um. A height of the second portion 462 is in a range of 0.5 um to 2 um.

The retaining wall 16 made by the mask of the pixel definition layer 126 is a staggered two-layer structure, which can effectively block the overflow of the fluid organic monomer, and is closer to the AA region than the existing retaining wall 16. It is advantageous to realize the narrow frame design of the flexible panel 11.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A flexible panel, comprising:
  a substrate, an organic light-emitting diode device, a thin-film encapsulation layer and a retaining wall;
  wherein the organic light-emitting diode device is formed on the substrate; the thin-film encapsulation layer is formed on the substrate and covers the organic light-emitting diode device; and the retaining wall is disposed on the substrate and is around an outside of the organic light-emitting diode device;
  wherein the retaining wall includes a first portion and a second portion, the first portion being closer to a light-emitting region of the flexible panel than the second portion;
  wherein the first portion and the second portion are interconnected to form a closed structure and the first portion and the second portion do not overlap each other in a direction perpendicular to an edge of the substrate;

wherein each of the first portion and the second portion of the retaining wall includes multiple protrusions that are disposed at intervals and around the organic light-emitting diode device, the protrusions of the first portion and the protrusions of the second portion being staggered, the protrusions of the first portion and the second portions being of a trapezoidal structure having an upper end having a narrow upper width and a lower end having a wide lower width, wherein the protrusions of the first portion and the protrusions of the second portion are alternately arranged such that the protrusions of the first portion and the second portion are connected to each other at the lower ends and are spaced from each other at the upper ends;

wherein the organic light-emitting diode device includes a driving circuit, a planarization layer, a first electrode, a pixel definition layer, and an organic light-emitting structure and a second electrode which are sequentially formed on the substrate; and wherein a material of the retaining wall and a material of the planarization layer and the pixel definition layer are the same, and the first portion and the second portion of the retaining wall are formed in a same mask process as the planarization layer and the pixel definition layer.

2. The flexible panel according to claim 1, wherein a height of each of the first portion and the second portion is in range of 0.01 um to 3 um, and a width of each of the first portion and the second portion is in a range of 5 um to 50 um.

3. The flexible panel according to claim 1, wherein the material of each of the retaining wall and the pixel definition layer is one or a combination of an organic material selected from a photoresist, an epoxy resin, a poly(methyl methacrylate) resin, a polyimide resin, an acrylic resin, or one or a combination of an inorganic material of a silicon compound.

4. A display device, comprising:
a flexible panel and a cover plate disposed on the flexible panel;
wherein the flexible panel comprises: a substrate, an organic light-emitting diode device, a thin-film encapsulation layer and a retaining wall; wherein the organic light-emitting diode device is formed on the substrate; the thin-film encapsulation layer is formed on the substrate and covers the organic light-emitting diode device; and the retaining wall is disposed on the substrate and is around an outside of the organic light-emitting diode device; and wherein the retaining wall includes a first portion and a second portion, the first portion being closer to a light-emitting region of the flexible panel than the second portion;
wherein the first portion and the second portion are interconnected to form a closed structure and the first portion and the second portion do not overlap each other in a direction perpendicular to an edge of the substrate; and
wherein each of the first portion and the second portion of the retaining wall includes multiple protrusions that are disposed at intervals and around the organic light-emitting diode device, the protrusions of the first portion and the protrusions of the second portion being staggered, the protrusions of the first portion and the second portions being of a trapezoidal structure having an upper end having a narrow upper width and a lower end having a wide lower width, wherein the protrusions of the first portion and the protrusions of the second portion are alternately arranged such that the protrusions of the first portion and the second portion are connected to each other at the lower ends and are spaced from each other at the upper ends;

wherein the organic light-emitting diode device includes a driving circuit, a planarization layer, a first electrode, a pixel definition layer, and an organic light-emitting structure and a second electrode which are sequentially formed on the substrate; and wherein a material of the retaining wall and a material of the planarization layer and the pixel definition layer are the same, and the first portion and the second portion of the retaining wall are formed in a same mask process as the planarization layer and the pixel definition layer.

5. The display device according to claim 4, wherein a height of each of the first portion and the second portion is in range of 0.01 um to 3 um, and a width of each of the first portion and the second portion is in a range of 5 um to 50 um.

6. The display device according to claim 4, wherein the material of each of the retaining wall and the pixel definition layer is one or a combination of an organic material selected from a photoresist, an epoxy resin, a poly(methyl methacrylate) resin, a polyimide resin, an acrylic resin, or one or a combination of an inorganic material of a silicon compound.

7. A manufacturing method for a flexible panel, comprising steps of:
forming a planarization layer and a portion of a retaining wall on a substrate by a same mask;
forming a first electrode pattern on the planarization layer;
forming the pixel definition layer and the other portion of the retaining wall on the planarization layer and the substrate using a same mask, wherein the pixel definition layer correspondingly defines a space of a light-emitting pixel on the planarization layer and the first electrode;
forming an organic light-emitting structure in a region where a light-emitting pixel defined by the pixel definition layer is located;
forming a second electrode on the organic light-emitting structure; and
forming a thin-film encapsulation layer on the substrate to perform an encapsulation;
wherein the retaining wall includes a first portion and a second portion, the first portion being closer to a light-emitting region of the flexible panel than the second portion;
wherein the first portion and the second portion are interconnected to form a closed structure and the first portion and the second portion do not overlap each other in a direction perpendicular to an edge of the substrate; and
wherein each of the first portion and the second portion of the retaining wall includes multiple protrusions that are disposed at intervals and around the organic light-emitting diode device, the protrusions of the first portion and the protrusions of the second portion being staggered, the protrusions of the first portion and the second portions being of a trapezoidal structure having an upper end having a narrow upper width and a lower end having a wide lower width, wherein the protrusions of the first portion and the protrusions of the second portion are alternately arranged such that the protrusions of the first portion and the second portion are connected to each other at the lower ends and are spaced from each other at the upper ends.

* * * * *